United States Patent
Geisler et al.

(10) Patent No.: US 10,270,428 B1
(45) Date of Patent: Apr. 23, 2019

(54) FILTER CIRCUIT WITH DYNAMIC PARAMETER GENERATION

(71) Applicant: Allegro MicroSystems, LLC, Manchester, NH (US)

(72) Inventors: Dominik Geisler, Heidelberg (DE); Craig S. Petrie, Merrimack, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/876,746

(22) Filed: Jan. 22, 2018

(51) Int. Cl.
- *G01L 3/10* (2006.01)
- *H03H 19/00* (2006.01)
- *B62D 5/04* (2006.01)
- *H03H 11/04* (2006.01)

(52) U.S. Cl.
CPC .......... *H03H 19/004* (2013.01); *G01L 3/104* (2013.01); *B62D 5/0409* (2013.01); *H03H 2011/0488* (2013.01)

(58) Field of Classification Search
CPC ......... H03H 19/004; H03H 2011/0488; H03H 7/0153; H03H 11/0472; H03H 11/1291; H03H 2210/00; H03H 2210/01; H03H 2210/02; H03H 2210/03; H03H 2210/04; G01L 3/104; G01L 3/10; G01L 3/101; B62D 5/0409; B62D 5/04
See application file for complete search history.

(56) References Cited

U.S. PATENT DOCUMENTS

| | | | |
|---|---|---|---|
| 7,990,209 B2 | 8/2011 | Romero | |
| 8,416,014 B2 | 4/2013 | Romero | |
| 9,917,570 B2 * | 3/2018 | Nikitin | H03H 7/0153 |
| 2009/0096515 A1 * | 4/2009 | Saitoh | H03H 11/1252 327/553 |
| 2012/0279320 A1 | 11/2012 | Coscoy et al. | |

* cited by examiner

*Primary Examiner* — Jung Kim
(74) *Attorney, Agent, or Firm* — Daly Crowley Mofford & Durkee LLP (57) ABSTRACT

A filter with dynamic parameter generation may comprises an input to receive an unfiltered signal, an output to provide a filtered signal, a filtering circuit that filters the unfiltered signal to produce the filtered signal according to a transfer function having at least one dynamic parameter, and a dynamic parameter generator circuit. The dynamic parameter generator circuit comprises an input to receive the unfiltered signal, a signal processing circuit to estimate a level of dynamics of the unfiltered signal, a parameter generation circuit to generate the at least one dynamic parameter based on the estimated level of dynamics of the unfiltered signal, and an output to provide the at least one dynamic parameter.

21 Claims, 7 Drawing Sheets

FILTER CIRCUIT WITH DYNAMIC PARAMETER GENERATION

FIELD

This disclosure relates to filters and, more particularly, digital filters with dynamic filter parameter generation.

BACKGROUND

Filter design often requires a compromise between filter bandwidth and effective noise reduction. Other filter implementation factors being equal, increasing a filter's bandwidth may require sacrificing the filter's ability to cancel signal noise, and increasing the filter's ability to cancel signal noise may require reduced filter bandwidth.

Some applications, such as a power steering application for example, may have different modes of operation where bandwidth or noise reduction is more important. For example, if a vehicle is traveling along a highway with only small adjustments being made to the steering, a filter that has increased noise reduction may be beneficial. In this case, a reduced filter bandwidth may be acceptable. However, if the vehicle is engaged in motion that requires more aggressive steering, such as hitting a curb, taking a ninety-degree turn or parallel parking, increased filter bandwidth may be desirable, while a lower level of noise reduction may be acceptable.

SUMMARY

In embodiments, it may be desirable for a filter to alter its operation to suit a current mode of operation. A filter that dynamically adjusts its filtering parameters based on an unfiltered version of a signal and a filtered version of the same signal may be desirable.

In an embodiment, a filter comprises an input to receive an unfiltered signal, an output to provide a filtered signal, a filtering circuit that filters the unfiltered signal to produce the filtered signal according to a transfer function having at least one dynamic parameter, and a dynamic parameter generator circuit. The dynamic parameter generator circuit comprises an input to receive the unfiltered signal, a signal processing circuit to estimate a level of dynamics of the unfiltered signal, a parameter generation circuit to generate the at least one dynamic parameter based on the estimated level of dynamics of the unfiltered signal, and an output to provide the at least one dynamic parameter.

In another embodiment, a torque measurement system comprises a torque sensor coupled to measure a torque of a rotating system and produce a torque signal and a filter. The filter comprises an input to receive the torque signal, an output to provide a filtered torque signal, a filtering circuit that filters the torque signal to produce the filtered torque signal according to a transfer function having at least one dynamic parameter, and a dynamic parameter generator circuit. The dynamic parameter generator circuit comprises an input to receive the unfiltered signal, a signal processing circuit to estimate a level of dynamics of the unfiltered signal, a parameter generation circuit to generate the at least one dynamic parameter based on the estimated level of dynamics of the unfiltered signal, and an output to provide the at least one dynamic parameter.

In another embodiment, a filter comprises an input to receive an unfiltered signal, an output to provide a filtered signal, a filtering circuit that filters the unfiltered signal to produce the filtered signal according to a transfer function having at least one dynamic parameter, and means for dynamically generating the at least one dynamic parameter.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
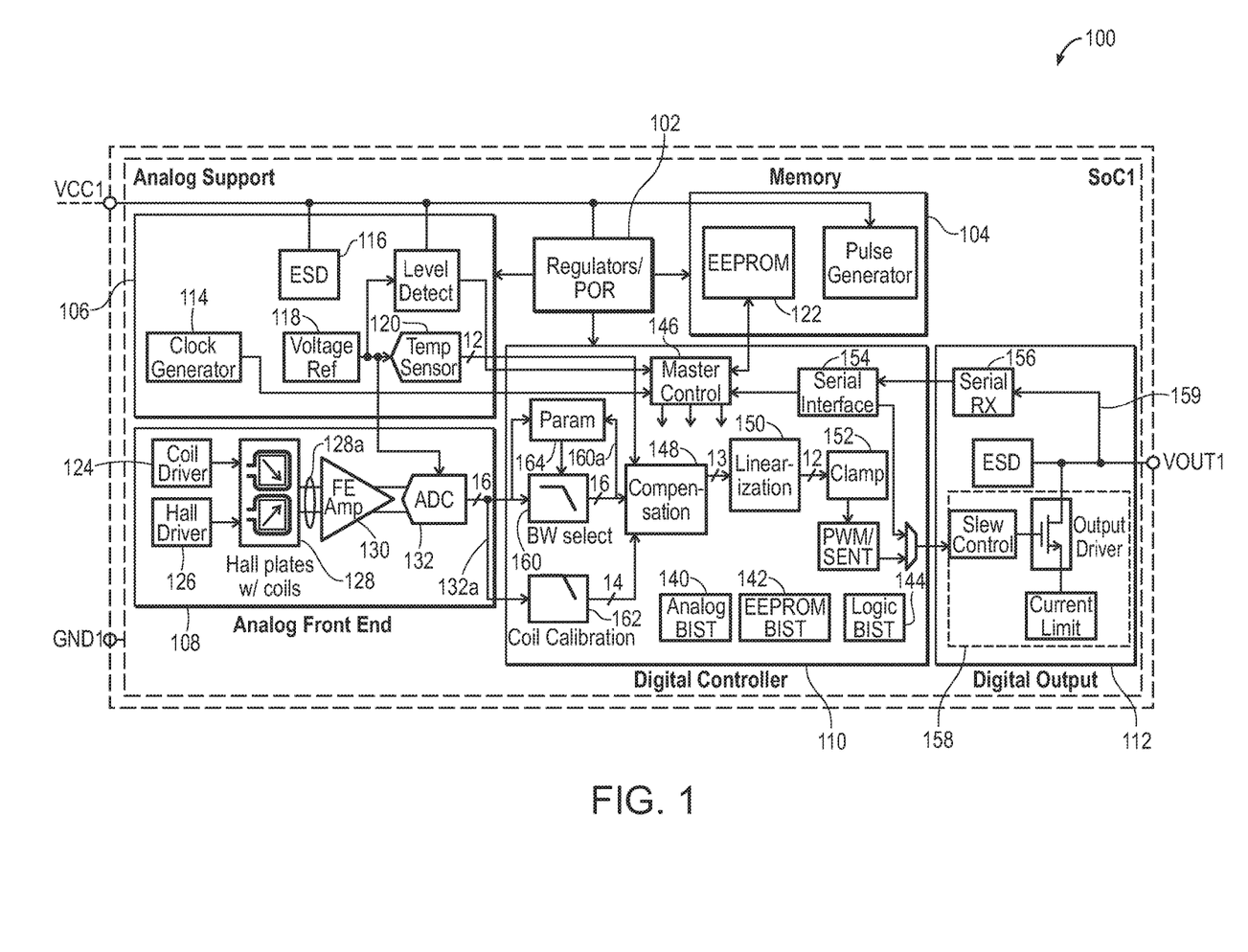
FIG. 1 is a block diagram of a sensor including a filter with dynamic parameter generation.

FIG. 1 is a block diagram of a sensor 100. Sensor 100 may be organized into various sub-sections containing circuits such as regulators 102 to provide electrical power, memory circuits 104 to provide data and configuration storage, analog support circuits 106 that provide services such as clock generation, voltage reference generations, etc., an analog front-end 108 to detect a magnetic field that may represent a torque and produce an analog signal representing the magnetic field, digital controller circuits 110 to receive and process the analog signal and produce a digital signal, and digital output circuits 112 to communicate information to other devices. In other embodiments, sensor 100 may also include an input receiver (not shown) to receive information from other devices.

Sensor 100 may be used in a system to detect torque on a rotating object. For example, sensor 100 may detect torque in a power steering system of a vehicle such as a car, truck, bus, or airplane. As the driver turns the steering wheel, the driver exerts rotational force on the steering column. Sensor 100 may be positioned to detect the amount of torque generated because of the rotational force.

In embodiments, a magnetic target that produces a magnetic field may be placed on the steering column, or on another rotating element within the steering system. Sensor 100 may detect changes in the magnetic field as the user exerts rotational force on the steering column. In other systems, the magnetic target may be replaced by a non-magnetic target. A back-bias magnetic source may produce a magnetic field that may become disturbed by motion of the non-magnetic target. In these systems, sensor 100 may detect changes in the magnetic field made by the non-magnetic target rather than directly detecting a magnetic field produced by the target. In yet other systems, eddy currents may be induced in a non-magnetic target by a changing magnetic field or by relative motion between a static magnetic field and the non-magnetic target. In these systems, sensor 100 may detect magnetic fields produced by the eddy currents. Sensor 100 may also be used in other systems and applications that use magnetic fields to detect torque.

In embodiments, sensor 100 may be implemented, in whole or in part, by integrated circuitry supported by a semiconductor substrate. The integrated circuitry may form a "chip," which may be enclosed in a semiconductor package.

As noted above, sensor 100 may include power circuits such as voltage regulators 102 to provide power to the various elements and circuits of sensor 100. Analog support circuits 106 may include an oscillator or other type of clock generator circuit 114. Electrostatic discharge ("ESD") protection circuitry 116 may be included throughout sensor 100 to protect from electrical overstress conditions. Voltage reference circuits 118 may provide reference voltages used by other circuits in sensor 100. A temperature sensor circuit 120 may detect the temperature of sensor 100. As will be discussed below, various operating parameters may be modified depending on the temperature of the part. In addition, temperature detection and compensating for changing temperature may be important in applications that are subject to large temperature swings, such as automotive applications.

Sensor 100 may also include memory circuits such as EEPROM 122, a ROM, a RAM, registers, or any other type of memory that can store data. In embodiments, configuration parameters that control or affect operation of sensor 100 may be stored in EEPROM 122.

The analog front end 108 may include a coil driver circuit 124 that provides current to a coil. Current through the coil may generate a magnetic field. A driver circuit 126 may provide power to one or more magnetic field sensing elements 128. In the embodiment shown in FIG. 1, magnetic field sensing elements 128 may be Hall effect elements. In other embodiments, magnetic field sensing elements 128 may be magnetoresistive elements. Magnetic field sensing elements 128 may detect the magnetic field and produce signal 128a representing the magnetic field.

In other embodiments, torque sensor 100 may not include a coil. Also, although the example shown in FIG. 1 is a magnetic field torque sensor, torque sensor 100 may not include magnetic field sensing elements. For example, torque sensor 100 may include a pressure sensor, a speed sensor, or another type of sensor to measure torque.

Analog front end 108 may include an amplifier 130 and analog-to-digital converter 132 to respectively amplify signal 128a and convert it to a digital signal 132a.

The digital controller section 110 may include various built-in self-tests ("BIST") such as an analog BIST 140 to test analog circuitry, an EEPROM BIST 142 to test EEPROM 122, and a logic BIST 144 to test logic and digital circuitry. A control circuit 146 may implement a state machine or other type of circuit to control operation of various other circuits within sensor 100. Compensation circuit 148 and, linearization circuit 150 may correct the sensed magnetic signal for circuit and environmental imperfections such as stress variations, temperature variations, fabrication process variations and nonlinear responses of field strength to mechanical position. Clamp circuit 152 may perform diagnostic checks to ensure the magnetic signal remains within a specified safe operational level.

Digital controller section 110 may also include a serial interface circuit 154 to communicate data with digital output section 112.

Digital output section 112 may include a serial receiver circuit 156 to read data from bus 159 and a driver circuit 158 to transmit data onto bus 159. In embodiments, digital output section 112 may implement communications according to a one-wire serial protocol such as the single end-point nibble transmission ("SENT") protocol. In other embodiments, any serial or parallel communication protocol may be implemented. In other embodiments, the output may be an analog output, a PWM output, or any other type of output to communicate data to an external circuit or processor.

Referring again to digital controller section 110, sensor 100 may include one or more digital filters 160, 162 to filter signal 132a. In the example shown, one filter (e.g. filter 160) may be used for adjusting bandwidth while the other (e.g. filter 162) may be used to perform calibration of coil driver circuit 124. In an embodiment, filter 160 and/or filter 162 may have a direct form II architecture and may be an IIR filter, an FIR filter, or other type of signal filter.

A dynamic parameter generation circuit 164 may dynamically generate filter parameters that can be used by filters 160, 162 to filter signal 132a. These parameters may be based, at least in part, on a measurement of the dynamics of the input signal. For example, if the input signal varies greatly, dynamic parameter generation circuit may generate parameters suitable for an input signal that varies greatly. In embodiments, this may result in a filter that has relatively greater bandwidth (and perhaps relatively decreased latency). If the input signal is relatively stable, dynamic parameter generation circuit may generate parameters suitable for an input signal that have a relatively stable value. In embodiments, this may result in a filter that has relatively lower bandwidth (and perhaps an increased latency). In FIG. 1, dynamic parameter generation circuit 164 is coupled to filter 160. However, in other embodiments, one or more dynamic parameter generation circuits like circuit 164 may be coupled to filter 160, filter 162, or other filters.

Dynamic parameter generation circuit 164 may receive one or more of unfiltered signal 132a and filtered signal 160a as inputs. Dynamic parameter generation circuit 164 may use one or more of these inputs to generate and provide one or more filter parameters that can be used by filter 160. Changes in the value of the filter parameters may affect or change the transfer function of filter 160.

Figure 2:
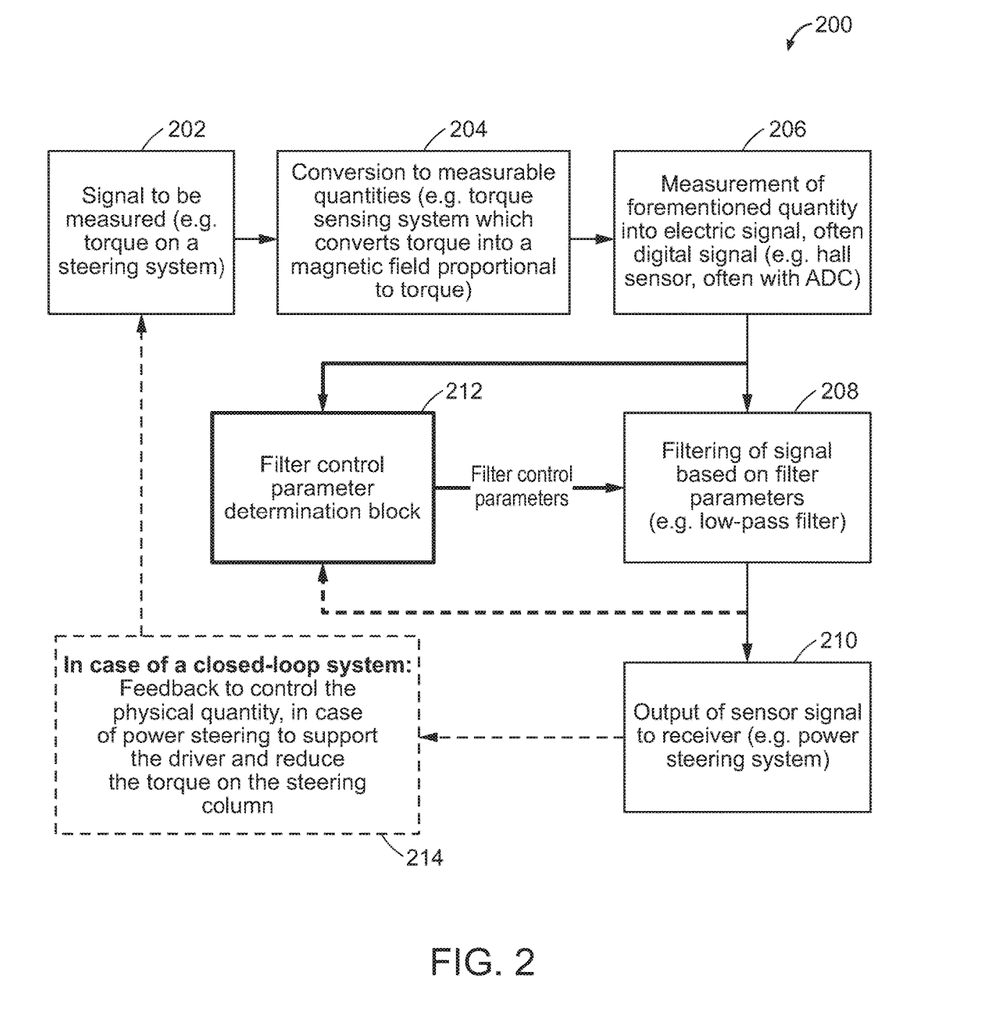
FIG. 2 is a flow diagram of the operation of a sensor that includes a filter with dynamic parameter generation.

Referring to FIG. 2, flow chart 200 provides an example of operation of sensor 100 in a power steering system. In box 202, a signal such as torque is generated, for example, by a user turning a steering wheel. In box 204, the torque is converted into a measurable quantity. For example, the torque may be represented by physical displacement of a magnetic target, which may cause changes in a detected magnetic field. In embodiments, two magnetic field collectors may be rotated in response to a torque to generate a magnetic field. The sensor may detect the magnetic field to measure the torque.

In box 206, sensor 100 may measure the magnetic field and generate signal 132a. The measurement may be performed, for example, by magnetic field sensing elements 128. In box 208, one or more filters (e.g. filter 160) may filter the unfiltered, measured signal 132a to produce filtered signal 160a. In box 212, dynamic parameter generation circuit 164 may generate a dynamic filter parameter that can be used to filter the signal in box 208. The value of the dynamic filter parameter may be based, at least in part, on a measurement of how dynamic the input signal currently is, and/or a measurement of how dynamic the input signal has been during or over. The dynamic filter parameter may be provided to filter 160 and used in box 208 to filter signal 132a.

In box 210, sensor 100 may transmit output data representing the measured torque onto bus 159. In a feedback system, in box 214, the data may be used to control the measured torque. For example, torque data generated by sensor 100 and received by an automotive power steering system may be used to activate the power steering system and provide steering assist by turning the wheels.

Electrical noise and sensor response time requirements in power steering systems may vary based on how the system is operating. For example, if a car is traveling along a highway, the driver may make relatively small adjustments to the steering. During these times, the power steering system (and measurement system to measure torque applied to the power steering system) may require low noise signal processing to ensure that the driver does not feel or hear the power steering system making small corrections to the steering system. Because only small steering adjustments are being made, the sensor may not require fast response times. In another example, if the car is traveling along a road that requires frequent and/or hard turns, or if the car wheels strike objects such as curbs or potholes, the power steering system may tolerate greater noise because a large torque is already being applied to the system. This example likely requires fast response time because the steering system input changes rapidly. Because of the broad range of noise and response time requirements, it may be beneficial to generate dynamic filter parameters that can be used based on amount of dynamic change in the signal that is present. If there are large, fast changes in the input signal, filter parameters that provide wide bandwidth may be used. If the signal is changing slowly, filter parameters that use a smaller bandwidth but provide more aggressive noise cancellation may be used.

Figure 3:
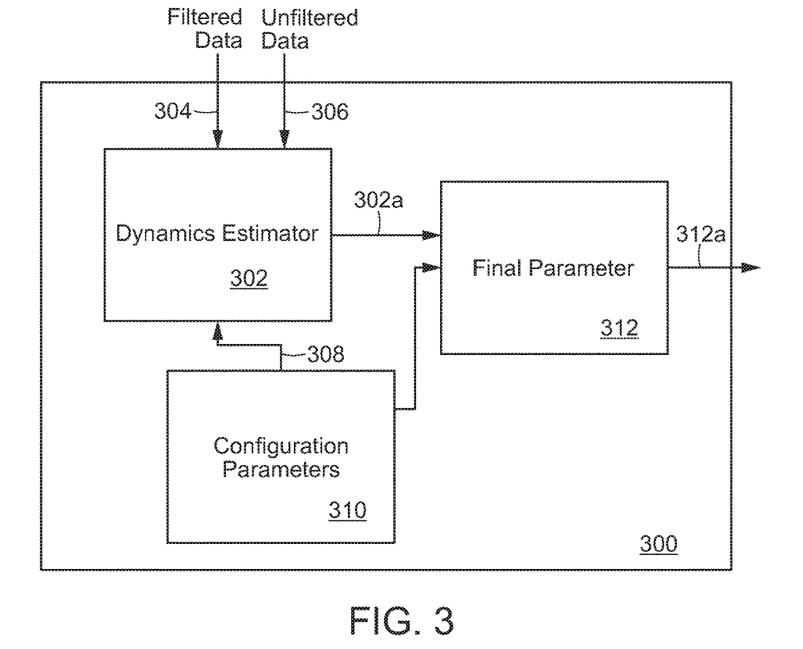
FIG. 3 is a block diagram of a dynamic parameter generation circuit.

FIG. 3 is a block diagram of a dynamic parameter generation circuit 300, which may be the same as or similar to dynamic parameter generation circuit 164. Dynamic parameter generation circuit 300 may include a dynamics estimator circuit 302 that generates a dynamic filter parameter 302a. In the embodiments shown, dynamics estimator circuit 302 may receive filtered data 304 and unfiltered data 306 as inputs. Unfiltered data 306 may be the same as or similar to signal 132a and filtered data 304 may be the same as or similar to signal 160a (see FIG. 1).

Configuration parameters block 310 may provide parameters used by dynamic parameter generation circuit 300 to generate dynamic parameter 302a. Final parameter circuit 312 may receive dynamic parameter 302a and generate a final parameter 312a that can be used by filter 160. For example, final parameter 312a may be an IIR or FIR filter coefficient (or set of coefficients). Final parameter generation circuit 312 may use dynamic parameter 302a to generate the final IIR or FIR filter coefficients, for example.

Figure 4A:
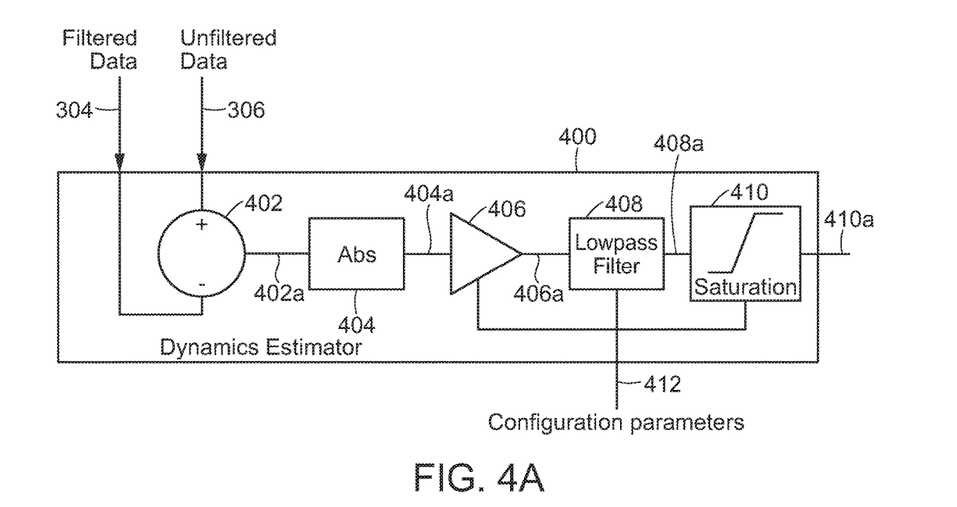
FIG. 4A, FIG. 4B, FIG. 4C, and FIG. 4D are block diagrams of embodiments of a dynamic parameter estimation circuit.

FIG. 4A is a block diagram of an embodiment of a dynamics estimator circuit 400 which may be the same as or similar to dynamics estimator circuit 302. Dynamics estimator circuit 400 may produce one or more dynamic parameters that can be used to affect the operation of the filter. Dynamics estimator circuit 400 may include a difference circuit 402 that receives filtered data signal 304 and unfiltered data signal 306 and generates a difference signal 402a that represents the difference between the two. Difference signal 402a may provide a measure of dynamics of unfiltered signal 306. For example, in an embodiment, difference signal 402a may be a type of differential signal that includes information about how much unfiltered signal 306 is changing over time. Absolute value circuit 404 may receive signal 402a, generate an absolute value of signal 402a, and provide the absolute value as signal 404a.

Dynamics estimator circuit 400 may include mapping circuit 406 that can map signal 404a to values that can be used as filter parameters. Mapping circuit 406 may apply a mathematical function to signal 404a to produce signal 406a. That function may be a scalar function (such as a multiplication or division by a constant), or a higher order function. In embodiments, mapping circuit 406 may provide a lookup function. For example, mapping circuit 406 may access a value in a lookup table that corresponds to the current value of signal 404a. Mapping circuit 406 may provide the value from the lookup table as signal 406a.

A lowpass filter 408 may filter noise from signal 406a to produce filtered signal 408a. In embodiments, lowpass filter 408 may be an IIR filter. Saturation circuit 410 may be used to limit the scope of the filter parameters by providing an upper and lower limit to the transfer function characteristics.

For example, a maximum bandwidth may be desired even in high-dynamics situations, because the maximum bandwidth of the input signals is known, or because the data output rate of the sensor is limited and a higher bandwidth would lead to under sampling of the data at the sensor output. Also, a minimum bandwidth may be desired to maintain system stability. Furthermore, saturating the parameters may be needed to satisfy numerical requirements of the following circuit, i.e. to prevent overflows or to fit into the prepared parameter range.

Mapping circuit 406, lowpass filter 408, and saturation circuit 410 may receive configuration parameters 412, which may affect the way mapping circuit 406, lowpass filter 408, and/or saturation circuit 410 operate. The configuration parameters 412 may be stored in a memory such as EEPROM 122. The configuration parameters 412 may include values (such as gain, mapping parameters, lookup table values, mathematical function coefficients, etc.) for mapping circuit 406, filter coefficients for filter 408, and/or parameter limits for saturation circuit 410. The configuration parameters 412 may change based on system noise, temperature, or control loop or customer requirements. For example, in some instances, sensor 100 may operate in a mode where amplifier 130 (FIG. 1) provides high gain. In these instances, noise in signal 132a may also be amplified. Configuration parameters 412 may be used to compensate for the increased noise. Similarly, if temperature sensor 120 indicates a particular temperature, configuration parameters 412 may be used to compensate for operation at the particular temperature. Furthermore, if the system outside the sensor requires a particular bandwidth, the parameters can be modified accordingly.

The output signal 410a may represent a dynamic parameter that can be used to modify the operation of filter 160. In one example, the transfer function of filter 160 may be:

$$H(z) = \frac{1}{2^{k+1}} \cdot \frac{1+z^{-1}}{1-(1-2^{-k}) \cdot z^{-1}} \quad (1)$$

In equation (1), H(z) represents the transfer function of filter 160, k represents the dynamic parameter 410a generated by dynamics estimator circuit 400, and z represents complex frequency according to the properties of the Z-transform. The dynamic parameter k (e.g. signal 410a or 302a) may be generated by dynamics estimator circuit 400 and received by final parameter circuit 312. Final parameter circuit 312 may use k to generate filter coefficients that implement H(z) and provide them as signal 312a. These coefficients may be received by filter 160 and used for filter operations on unfiltered signal 132a.

Figure 4B:
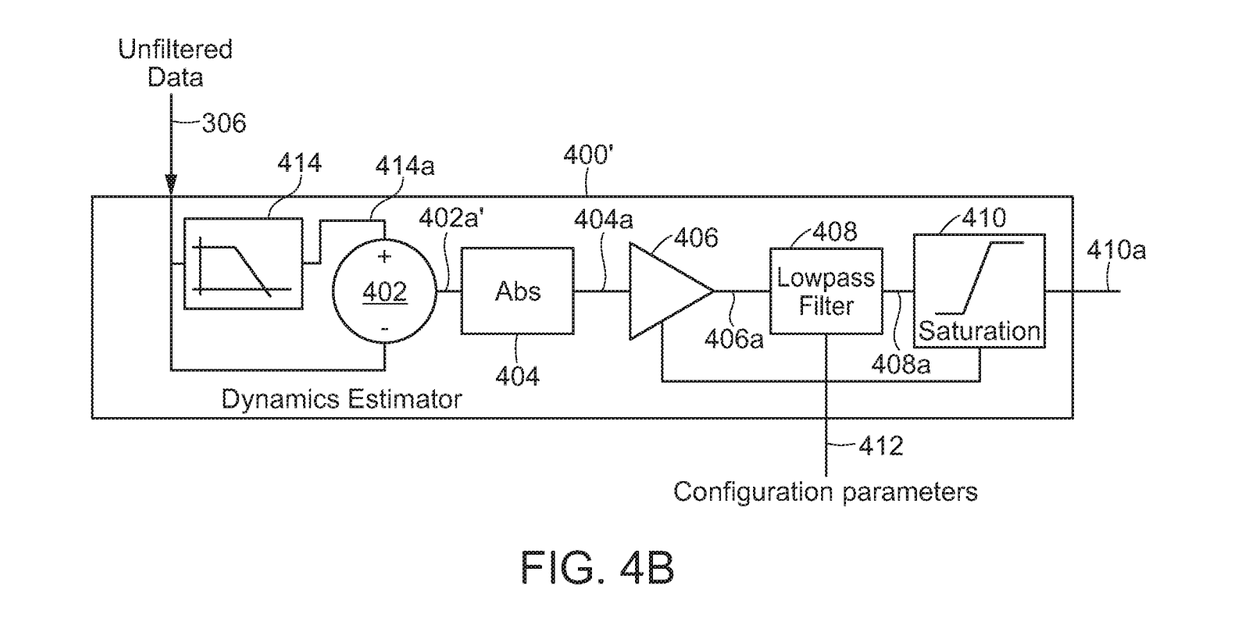

FIG. 4B is a block diagram of an embodiment of a dynamics estimator circuit 400' which may be the same as or similar to dynamics estimator circuit 302. Dynamics estimator circuit 400' may produce one or more dynamic parameters that can be used to affect the operation of the filter. Dynamics estimator circuit 400' may include a difference circuit 402 and a low pass filter 414 to produce signal 402a representing a measure of dynamics of unfiltered signal 306. Lowpass filter 414 receives unfiltered signal 306 as an input and produces signal 414a as an output. Signal 414a may represent low frequency components of signal 306.

Difference circuit 402 receives unfiltered signal 306 and signal 414a as inputs, and produces signal 402a', representing the difference between signal 306 and signal 414a. Because filter 414 and difference circuit 402 effectively remove low frequency components from signal 306 to produce signal 402a', signal 402a' may provide a measure of dynamics of signal 306 that can subsequently be used to generate dynamic filter parameters.

Figure 4C:
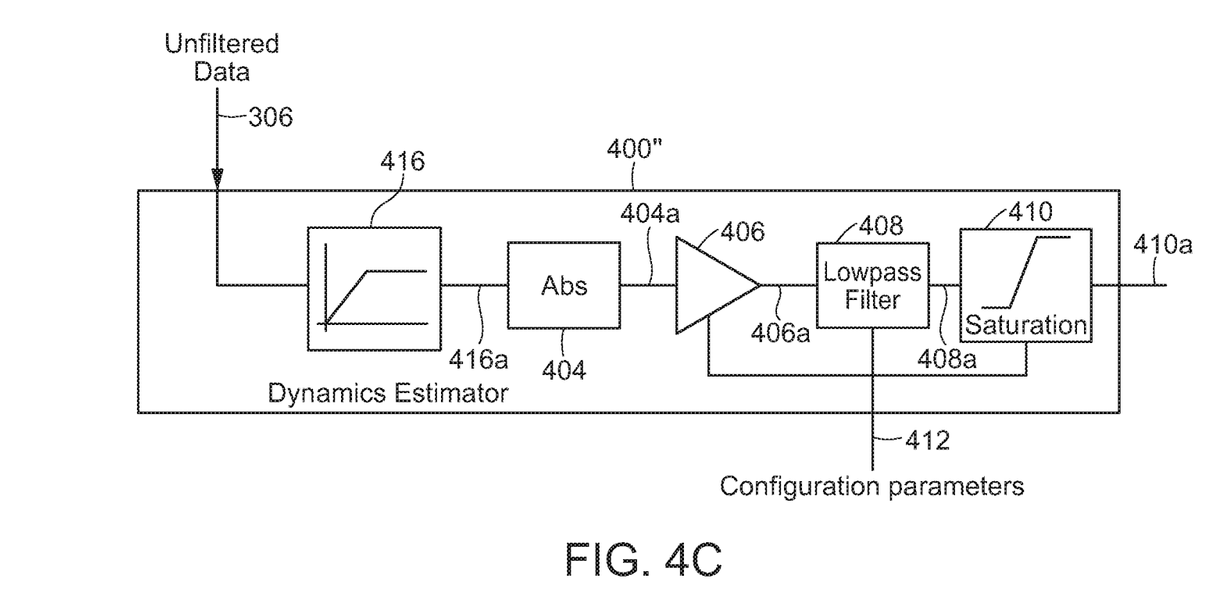

FIG. 4C is a block diagram of an embodiment of a dynamics estimator circuit 400'' which may be the same as or similar to dynamics estimator circuit 302. Dynamics estimator circuit 400'' may produce one or more dynamic parameters that can be used to affect the operation of the filter. Dynamics estimator circuit 400'' may include a high-pass filter 416 that receives unfiltered signal 306 and produces signal 416a. Signal 416a may represent high frequency components of unfiltered signal 306. Thus, signal 416a may provide a measure of dynamics of signal 306 that can subsequently be used to generate dynamic filter parameters.

Figure 4D:
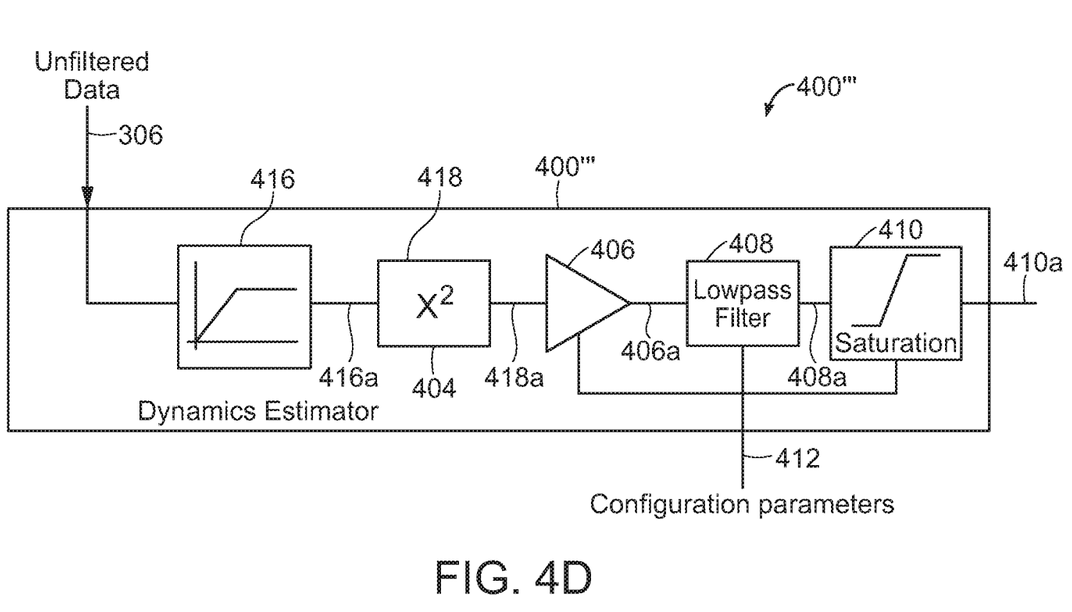

FIG. 4D is a block diagram of an embodiment of a dynamics estimator circuit 400''' which may be the same as or similar to dynamics estimator circuit 302. Dynamics estimator circuit 400''' may produce one or more dynamic parameters that can be used to affect the operation of the filter. Dynamics estimator circuit 400''' may include a high-pass filter 416 that receives unfiltered signal 306 and produces signal 416a. Signal 416a may represent high frequency components of unfiltered signal 306. Thus, signal 416a may provide a measure of dynamics of signal 306 that can subsequently be used to generate dynamic filter parameters.

In dynamics estimator circuit 400''', absolute value circuit 404 has been replaced with normalization circuit 418. Normalization circuit 408 may receive a signal (such as signal 416a, signal 402a, signal 402a', etc.) representing a measure of dynamics of signal 306 and apply a mathematical function to that signal. The mathematical function may be $X^2$, as shown in FIG. 4D, or any other function that can replace negative values of signal 416a with positive values, to produce normalized signal 418a. The mathematical function is not limited to the function $X^2$. In other embodiments, the mathematical function may be an offset added to signal 416a, an absolute value function (as shown by absolute value circuit 404), an exponential function $X^Y$ where Y is an even number, or any other function that can normalize signal 416a.

In other embodiments, the normalization circuit 418 may be removed. In these embodiments, mapping circuit 406 may be configured to process negative input values to produce output signal 406a.

Figure 5:
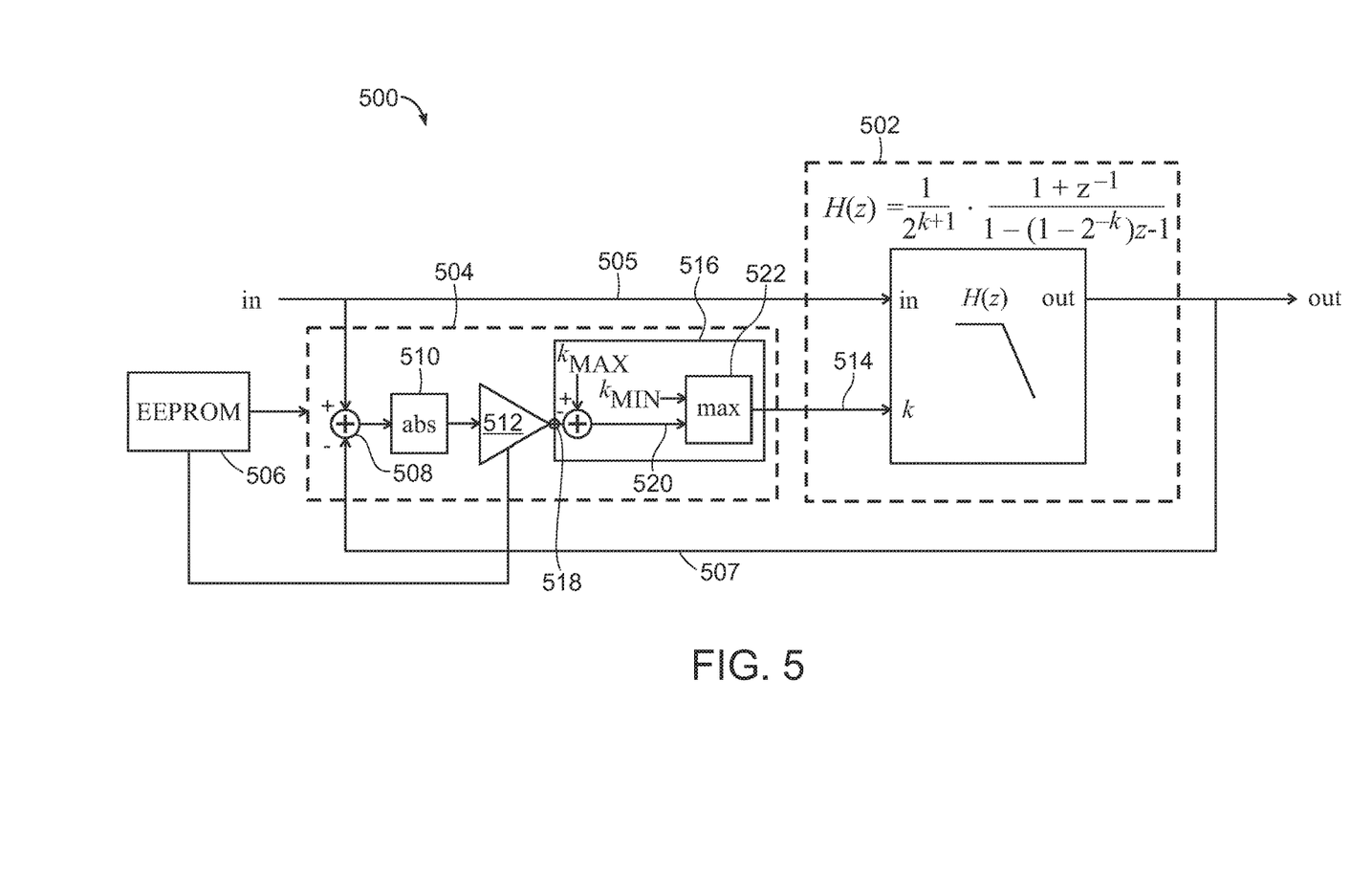
FIG. 5 is a block diagram of a filter including dynamic parameter generation.

Referring to FIG. 5, block diagram 500 illustrates another example of a filter 502 and dynamic parameter generation circuit 504. Filter 502 may be the same as or similar to filter 160 (see FIG. 1) and dynamic parameter generation circuit 504 may be the same as or similar to dynamic parameter generation circuit 164. Although not shown in FIG. 5, in embodiments, dynamic parameter generation circuit 504 may include a final parameter circuit such as final parameter circuit 312. EEPROM 506 may be the same as or similar to EEPROM 122. As illustrated, filter 502 may have a transfer function shown in formula 1 above. Of course, in other designs, filter 502 may have a different transfer function to filter signal 505.

Dynamic parameter circuit 504 may include a difference circuit 508 that may be the same as or similar to difference circuit 402 (FIG. 4) that receives unfiltered signal 505 and filtered signal 507. Unfiltered signal 505 may be the same as or similar to unfiltered signal 132a and filtered signal 507 may be the same as or similar to filtered signal 160a.

Absolute value circuit 510 may be the same as or similar to absolute value circuit 404 and amplifier 512 may be the same as or similar to mapping circuit 406. Although not shown, dynamic parameter circuit 504 may include a low-pass filter, saturation circuit, and/or other components to process the signal.

Amplifier 512 may receive configuration parameters stored in EEPROM 506 that affect the gain of amplifier 512, as discussed above in relation to mapping circuit 406.

Signal 514 may be a dynamic parameter signal generated by dynamic parameter generation circuit 504. In embodiments, signal 514 may by represented by k in formula 1 above.

Dynamic parameter generation circuit 504 may also include a minimum and maximum circuit 516 to impose a minimum and/or maximum value on dynamic parameter signal 514. In the example shown, a predetermined maximum value $k_{MAX}$ is added to the output signal 518 of amplifier 512 to produce signal 520. Because the output of multiplier block 512 may always be non-negative, $k_{MAX}$ may become the maximum output of minimum and maximum circuit 516. Circuit 522 then compares signal 520 to a predetermined minimum value $k_{MIN}$ to determine which is larger. Circuit 522 then outputs the larger of the two signals as dynamic parameter signal 514. One skilled in the art will recognize that other circuits or techniques may be used to impose a minimum and/or maximum value on dynamic parameter signal 514.

In embodiments, sensor 100 and/or filter 160 may be implemented, in whole or in part, by a processing system executing software. The processing system may minimally include a processor, a memory, an input and/or output circuit, and software executing on the processor. The memory may be a ROM or RAM, and may store data and software instructions which, when executed by the processor, cause the processing system to perform filtering operations (e.g. IIR or FIR operations) like those described above. The processor may use the data and software instructions to perform filtering operations in data in the memory and/or data received at the input, and produce filtered data that may be stored in the memory and/or transmitted on the output.

The processor may be a programmable circuit such as a field-programmable gate array (FPGA), a signal processor, a general-purpose processor, a custom processor, etc. The memory may be a ROM, a RAM, or a storage medium such as a DVD, hard drive, CD, etc. The input and output may be any sort of communication bus including, but not limited to, a USB bus, an Ethernet bus, a wireless communications link, a SENT bus, etc. The software instructions may include scripts, compiled software instructions, firmware instructions, byte-code, machine instructions, or any type of instruction that can be executed by the processor.

Many of the examples above relate to torque sensors. However, one skilled in the art will recognize that the dynamic filtering systems and methods may be used in many applications and are not limited to torque sensors.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited in this document are incorporated here by reference in their entirety.

The invention claimed is:

1. A filter comprising:
   an input to receive an unfiltered signal;
   an output to provide a filtered signal;
   a filtering circuit that filters the unfiltered signal to produce the filtered signal according to a transfer function having at least one dynamic parameter; and
   a dynamic parameter generator circuit comprising:
      an input to receive the unfiltered signal;
      a signal processing circuit to estimate a level of dynamics of the unfiltered signal;
      a parameter generation circuit to generate the at least one dynamic parameter based on the estimated level of dynamics of the unfiltered signal; and
      an output to provide the at least one dynamic parameter;
   wherein the transfer function is
   $H=(1/(2^{k+1}))*((1+z^{-1})/(1-(1-2^{-k})*z^{-1}))$, where H is the transfer function, k is the at least one dynamic parameter, and z is a discrete time step.

2. The filter of claim 1 wherein:
   the dynamic parameter generator circuit comprises an input to receive the filtered signal;
   the signal processing circuit comprises a difference circuit to compute a difference between the filtered signal and the unfiltered signal; and
   the level of dynamics of the unfiltered signal is determined by calculating the difference between the filtered signal and the unfiltered signal.

3. The filter of claim 1 wherein the dynamic parameter generator circuit comprises a circuit to remove negative values from the estimated level of dynamics comprising one or more of: an absolute value circuit, a normalization circuit, and a squaring circuit.

4. The filter of claim 1 wherein the filter is an IIR filter.

5. The filter of claim 4 wherein the IIR filter is implemented by a direct form II architecture.

6. The filter of claim 1 further comprising a memory, wherein the dynamic parameter generator circuit is coupled to receive configuration parameters from the memory.

7. The filter of claim 1 wherein the dynamic parameter generator circuit further comprises a parameter mapping circuit configured to map one or more values of the at least one dynamic parameter to one or more values of the estimated level of dynamics.

8. The filter of claim 7 wherein the parameter mapping circuit comprises a scalar multiplier circuit, a lookup table, or both.

9. The filter of claim 8 wherein the scalar multiplier circuit is coupled to receive a scalar value stored in a memory.

10. The filter of claim 9 wherein the scalar value varies based on one or more of: temperature, noise, and a mode of operation of the filter.

11. The filter of claim 1 wherein the dynamic parameter generator circuit further comprises one or more configuration parameters, and a final parameter generator circuit coupled to receive the estimated level of dynamics and generate at least one final filter parameter based on the estimated level of dynamics and the one or more configuration parameters.

12. The filter of claim 1 wherein the dynamic parameter generator circuit generates the at least one dynamic parameter to have a value between a predetermined maximum value and a predetermined minimum value.

13. The filter of claim 1 wherein the unfiltered signal is a measured magnetic field signal.

14. The filter of claim 13 wherein the measured magnetic field signal represents a torque.

15. The filter of claim 13 wherein the measured magnetic field signal is generated by a magnetic field sensing element of a torque sensor in a power steering system.

16. A torque measurement system comprising:
a torque sensor coupled to measure a torque of a rotating system and produce a torque signal;
filter comprising:
an input to receive the torque signal;
an output to provide a filtered torque signal;
a filtering circuit that filters the torque signal to produce the filtered torque signal according to a transfer function having at least one dynamic parameter; and
a dynamic parameter generator circuit comprising:
an input to receive the unfiltered signal;
a signal processing circuit to estimate a level of dynamics of the unfiltered signal;
a parameter generation circuit to generate the at least one dynamic parameter based on the estimated level of dynamics of the unfiltered signal; and
an output to provide the at least one dynamic parameter;
wherein the transfer function is $H=(1/(2^{k+1}))*((1+z^{-1})/(1-(1-2^{-k})*z^{-1}))$, where H is the transfer function, k is the at least one dynamic parameter, and z is a discrete time step.

17. The system of claim 16 wherein:
the dynamic parameter generator circuit comprises an input to receive the filtered signal;
the signal processing circuit comprises a difference circuit to compute a difference between the filtered signal and the unfiltered signal; and
the level of dynamics of the unfiltered signal is the difference between the filtered signal and the unfiltered signal.

18. The system of claim 16 wherein the dynamic parameter generator circuit further comprises a parameter mapping circuit configured to map one or more values of the at least one dynamic parameter to one or more values of the estimated level of dynamics.

19. The system of claim 16 wherein the dynamic parameter generator circuit further comprises one or more configuration parameters, and a final parameter generator circuit coupled to receive the estimated level of dynamics and generate at least one final filter parameter based on the estimated level of dynamics and the one or more configuration parameters.

20. The system of claim 16 wherein the dynamic parameter generator circuit generates the at least one dynamic parameter to have a value between a predetermined maximum value and a predetermined minimum value.

21. The system of claim 16 wherein the rotating system is a power steering system.

* * * * *